United States Patent
Adusumilli et al.

(10) Patent No.: US 10,593,659 B2
(45) Date of Patent: *Mar. 17, 2020

(54) DEEP HIGH CAPACITY CAPACITOR FOR BULK SUBSTRATES

(71) Applicant: International Business Machines Corporation, Armonk, NY (US)

(72) Inventors: Praneet Adusumilli, Albany, NY (US); Keith E. Fogel, Hopewell Junction, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

This patent is subject to a terminal disclaimer.

(21) Appl. No.: 15/474,724

(22) Filed: Mar. 30, 2017

(65) Prior Publication Data

US 2018/0286848 A1 Oct. 4, 2018

(51) Int. Cl.

| | |
|---|---|
| *H01L 27/01* | (2006.01) |
| *H01L 21/822* | (2006.01) |
| *H01L 21/283* | (2006.01) |
| *H01L 21/324* | (2006.01) |
| *H01L 21/306* | (2006.01) |
| *H01L 49/02* | (2006.01) |
| *H01L 29/66* | (2006.01) |
| *H01L 27/108* | (2006.01) |

(Continued)

(52) U.S. Cl.
CPC .......... *H01L 27/013* (2013.01); *H01L 21/283* (2013.01); *H01L 21/30604* (2013.01); *H01L 21/324* (2013.01); *H01L 21/8221* (2013.01); *H01L 27/1087* (2013.01); *H01L 27/10829* (2013.01); *H01L 28/60* (2013.01); *H01L 28/87* (2013.01); *H01L 28/91* (2013.01); *H01L 29/66181* (2013.01); *H01L 29/945* (2013.01); *H01L 27/0805* (2013.01)

(58) Field of Classification Search
CPC ......... H01L 27/10829; H01L 27/10861; H01L 29/66181; H01L 29/945

See application file for complete search history.

(56) References Cited

U.S. PATENT DOCUMENTS

| | | |
|---|---|---|
| 5,449,630 A | 9/1995 | Lur et al. |
| 6,448,131 B1 | 9/2002 | Cabral, Jr. et al. |

(Continued)

OTHER PUBLICATIONS

List of IBM Patents or Patent Applications Treated as Related dated Nov. 15, 2017, 2 Pages.

(Continued)

*Primary Examiner* — Changhyun Yi
(74) *Attorney, Agent, or Firm* — Scully, Scott, Murphy & Presser, P.C.; Daniel P. Morris, Esq.

(57) ABSTRACT

A deep trench capacitor having a high capacity is formed into a deep trench having faceted sidewall surfaces. The deep trench is located in a bulk silicon substrate that contains an upper region of undoped silicon and a lower region of n-doped silicon. The lower region of the bulk silicon substrate includes alternating regions of n-doped silicon that have a first boron concentration (i.e., boron deficient regions), and regions of n-doped silicon that have a second boron concentration which is greater than the first boron concentration (i.e., boron rich regions).

10 Claims, 14 Drawing Sheets

(51) Int. Cl.
*H01L 29/94* (2006.01)
*H01L 27/08* (2006.01)

(56) References Cited

U.S. PATENT DOCUMENTS

| | | | |
|---|---|---|---|
| 6,495,411 B1 * | 12/2002 | Mei | H01L 21/30608 |
| | | | 257/301 |
| 6,936,879 B2 | 8/2005 | Furukawa et al. | |
| 8,227,311 B2 | 7/2012 | Cheng et al. | |
| 8,354,675 B2 | 1/2013 | Kwon et al. | |
| 8,557,657 B1 | 10/2013 | Basker et al. | |
| 9,059,233 B2 | 6/2015 | Leidy et al. | |
| 9,219,144 B2 | 12/2015 | Mauder et al. | |
| 9,231,089 B2 | 1/2016 | Leidy et al. | |
| 9,240,454 B1 | 1/2016 | Liu et al. | |
| 10,147,609 B2 | 12/2018 | Chen et al. | |
| 2003/0030091 A1 * | 2/2003 | Bulsara | H01L 27/1087 |
| | | | 257/301 |
| 2011/0272702 A1 * | 11/2011 | Kwon | H01L 27/10867 |
| | | | 257/71 |
| 2012/0086064 A1 | 4/2012 | Cheng et al. | |
| 2015/0137186 A1 | 5/2015 | Leidy et al. | |
| 2015/0228769 A1 | 8/2015 | Leidy et al. | |

OTHER PUBLICATIONS

Notice of Allowance dated May 21, 2018 received in U.S. Appl. No. 15/813,942.

* cited by examiner

DEEP HIGH CAPACITY CAPACITOR FOR BULK SUBSTRATES

BACKGROUND

The present application relates to a semiconductor structure and a method of forming the same. More particularly, the present application relates to a semiconductor structure including a deep trench capacitor having a high capacity and located in a bulk silicon substrate as well as a method of forming the same.

In the semiconductor industry, deep trenches, which typical have a depth exceeding 1 micron (µm), are employed to provide a variety of useful devices including a deep trench capacitor. The deep trenches may be utilized in a stand-alone semiconductor circuit such as, for example, a dynamic random access memory (DRAM) circuit to provide deep trench capacitors, or the deep trenches may be utilized as an embedded circuit component of a semiconductor chip that also includes other semiconductor circuits such as a processor core or other logic circuits. Particularly, embedded deep trench capacitors may be used to enable an embedded memory device, for example, an embedded dynamic random access memory (eDRAM) cell, a passive component of a radio frequency (RF) circuit, or a decoupling capacitor that provides a stable voltage supply in a semiconductor circuit.

Typically, deep trench capacitors are formed into a semiconductor handle substrate of a semiconductor-on-insulator (SOI) substrates; the semiconductor handle substrate is located beneath a buried insulator layer and an active semiconductor device layer of the SOI substrate. SOI substrates have been employed in the semiconductor industry for performance benefits do to reduced capacitive coupling between semiconductor devices and the semiconductor handle substrate.

Despite the benefits that SOI substrates provide in eDRAM manufacturing, there is an ongoing desire to replace SOI substrates with bulk semiconductor substrates since bulk semiconductor substrates are cheaper and are more readily available. Notably, there is a need for providing a deep trench capacitor that has a high capacity and that is formed in a bulk semiconductor substrate.

SUMMARY

A deep trench capacitor having a high capacity is formed into a deep trench having faceted sidewall surfaces. The deep trench is located in a bulk silicon substrate that contains an upper region of undoped silicon and a lower region of n-doped silicon. The lower region of the bulk silicon substrate includes alternating regions of n-doped silicon that have a first boron concentration (i.e., boron deficient regions), and regions of n-doped silicon that have a second boron concentration which is greater than the first boron concentration (i.e., boron rich regions as compared to the boron deficient regions).

In aspect of the present application, a semiconductor structure is provided. In one embodiment, the semiconductor structure includes a deep trench capacitor present in a deep trench having faceted sidewall surfaces that is located in a bulk silicon substrate, wherein the bulk silicon substrate includes an upper region of undoped silicon and a lower region of n-doped silicon, wherein the lower region comprises alternating regions of n-doped silicon that have a first boron concentration, and regions of n-doped silicon that have a second boron concentration which is greater than the first boron concentration.

In another embodiment, the semiconductor structure includes a first deep trench capacitor present in a first deep trench having faceted sidewall surfaces that is located in a bulk silicon substrate, wherein the bulk silicon substrate includes an upper region of undoped silicon and a lower region of n-doped silicon, wherein the lower region comprises alternating regions of n-doped silicon that have a first boron concentration, and regions of n-doped silicon that have a second boron concentration which is greater than the first boron concentration. A second deep trench capacitor is present in a second deep trench having faceted sidewall surfaces that is located in the bulk silicon substrate, wherein a flowable dielectric material is located in a lower portion of the second deep trench and located entirely beneath the second deep trench capacitor.

In another aspect of the present application, a method of forming a semiconductor structure is provided. In one embodiment, the method may include first forming a deep trench in a precursor bulk semiconductor substrate, wherein the precursor bulk semiconductor substrate comprises, from bottom to top, a base silicon substrate, a semiconductor material stack of alternating layers of boron doped silicon and silicon, and a silicon device layer, and wherein the deep trench exposes a sub-surface of the base silicon substrate. Next, a hanging spacer is formed on physically exposed sidewall surfaces of the silicon device layer within the deep trench. A crystallographic etch is then performed in the deep trench that etches the layers of silicon selective to layers of boron doped silicon, wherein the etched silicon surfaces in the deep trench have a faceted sidewall surface. Next, the deep trench containing faceted sidewall surfaces is filled with an n-doped source material. An anneal is then performed to drive n-type dopant from the n-doped source material into the base silicon substrate, the semiconductor material stack, and the silicon device layer of the precursor bulk semiconductor substrate. Next, the n-doped source material and each hanging spacer are removed from the deep trench containing the faceted sidewall surfaces, and thereafter, a deep trench capacitor is formed in the deep trench containing the faceted sidewall surfaces.

DETAILED DESCRIPTION

Figure 1:
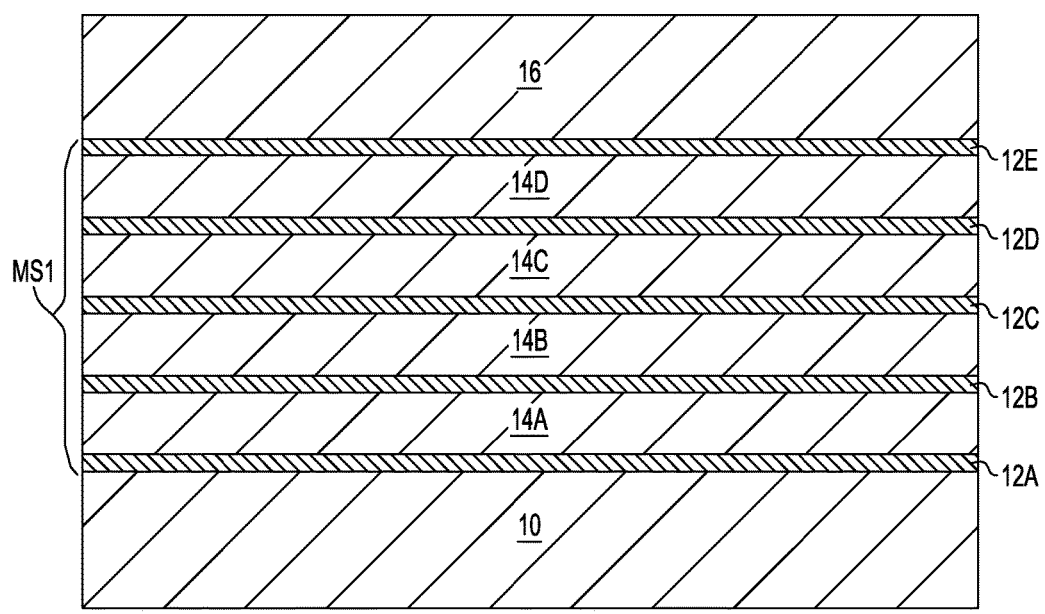
FIG. 1 is a cross sectional view of an exemplary semiconductor structure including, from bottom to top, a base silicon substrate, a semiconductor material stack of alternating layers of boron doped silicon and silicon, and a silicon device layer that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in the present application. Notably, the exemplary semiconductor structure shown in FIG. 1 includes, from bottom to top, a base silicon substrate 10, a semiconductor material stack MS1, and a silicon device layer 16. No insulator layer is located between any of the base silicon substrate 10, the semiconductor material stack MS1, and the silicon device layer 16, and no insulator layer is present in the semiconductor material stack MS1. Thus, the base silicon substrate 10, the semiconductor material stack MS1, and the silicon device layer 16 collectively may be referred to as a precursor bulk semiconductor substrate.

The base silicon substrate 10 is typically a single crystalline silicon layer. The base silicon substrate 10 is typically non-doped at this point of the present application. The base silicon substrate 10 may have any well known crystallographic orientation including, for example, {100}, {110}, or {111}. The base silicon substrate 10 can have a thickness from 500 microns to 1000 microns. Other thicknesses that are lesser than, or greater than, the aforementioned thickness values may also be used as the thickness of the base silicon substrate 10.

The semiconductor material stack MS1 includes alternating layers of boron doped silicon or B:Si, for short, (e.g., 12A, 12B, 12C, 12E), and silicon (e.g., 14A, 14B, 14C, 14D). In accordance with the present application, each layer of silicon of the semiconductor material stack MS1 is sandwiched between a lower boron doped silicon layer and an upper boron doped silicon layer. Thus, the semiconductor material stack MS1 includes 'n' number of silicon layers, wherein n is at least 1, and n+1 number of boron doped silicon layers; the upper value of 'n' may vary and is used to determine the overall thickness of the precursor bulk semiconductor substrate. By way of one example, five layers of boron doped silicon, and four layers of silicon are illustrated within the semiconductor material stack MS1 of FIG. 1. Each of the various layers within the semiconductor material stack MS1 is typically single crystalline.

The term "boron doped silicon" is used throughout the present application to denote a silicon layer that is doped with boron. The concentration of boron that is present in the boron doped silicon layers (e.g., 12A, 12B, 12C, 12E) of the semiconductor material stack MS1 can be from 1E18 atoms/cm$^3$ to 10E18 atoms/cm$^3$. Each silicon layer (e.g., 14A, 14B, 14C, 14D) of the semiconductor material stack MS1 is not alloyed with another semiconductor material and is non-doped at this point of the present application.

Each boron doped silicon layer (e.g., 12A, 12B, 12C, 12E) of the semiconductor material stack MS1 has a first thickness, while each silicon layer (e.g., 14A, 14B, 14C, 14D) of the semiconductor material stack MS1 has a second thickness that is greater than the first thickness. In one example, each boron doped silicon layer (e.g., 12A, 12B, 12C, 12E) of the semiconductor material stack MS1 may have a thickness from 2 nm to 10 nm, while each silicon layer (e.g., 14A, 14B, 14C, 14D) of the semiconductor material stack MS1 may have a thickness from 50 nm to 500 nm.

The semiconductor material stack MS1 can be formed utilizing an epitaxial growth or epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Thus, each layer within the semiconductor material stack MS1 has an epitaxial relationship with each other as well as having an epitaxial relationship with the growth surface of the base silicon substrate 10.

Examples of various epitaxial growth processes that are suitable for use in forming the semiconductor material stack MS1 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well known silicon source gases such as, for example, a silane, may be used for the deposition of the various layers of the semiconductor material stack MS1. Carrier gases like hydrogen, nitrogen, helium and argon can be used. In the present application, each boron doped silicon layer within the semiconductor material stack MS1 is formed by introducing a boron dopant into the silicon source gas, and each silicon layer of the semiconductor material stack MS1 is formed by eliminating the boron dopant from the silicon source gas.

The silicon device layer 16 is formed upon the topmost boron doped silicon layer (e.g., 12E) of the semiconductor material stack MS1 utilizing an epitaxial growth process as mentioned above without the presence of any boron dopant within the silicon source gas. The silicon device layer 16 is typically a single crystalline silicon layer. The silicon device layer 16 is typically non-doped at this point of the present application. The silicon device layer 16 can have a thickness from 200 nm to 1000 nm. Other thicknesses that are lesser than, or greater than, the aforementioned thickness values may also be used as the thickness of the silicon device layer 16.

Figure 2:
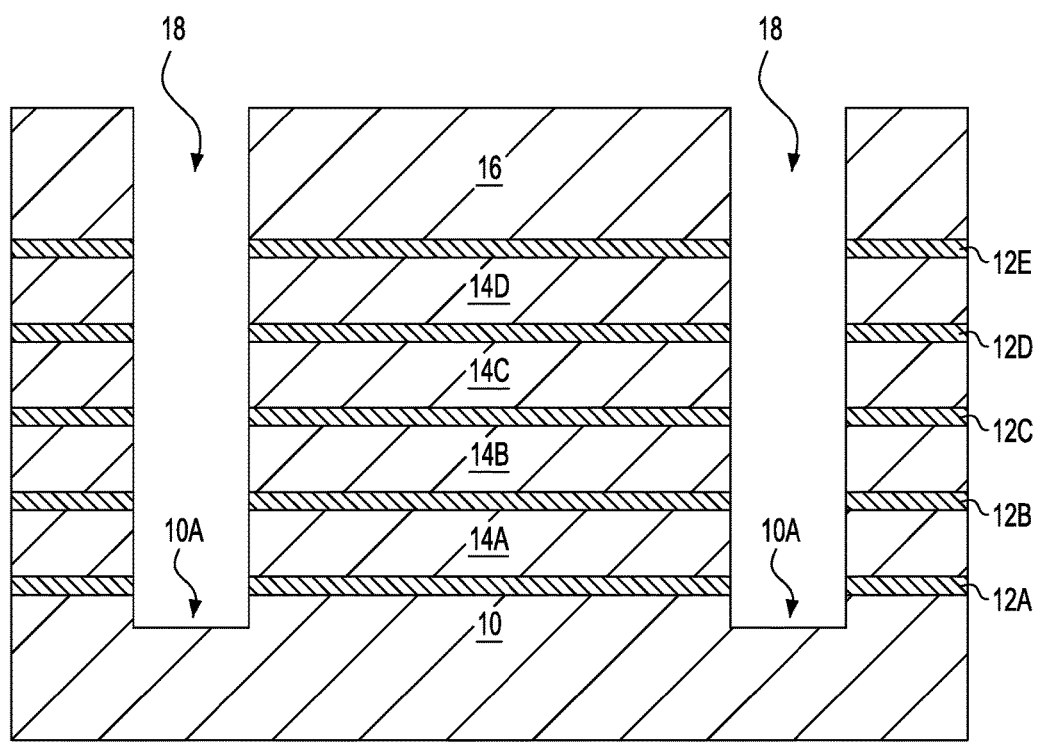
FIG. 2 is a cross sectional view of the exemplary semiconductor structure of FIG. 1 after forming a deep trench that exposes a sub-surface of the base silicon substrate.

Referring now to FIG. 2, there is illustrated the exemplary semiconductor structure of FIG. 1 after forming a deep trench 18 that exposes a sub-surface 10A of the base silicon substrate 10. The term "sub-surface" is used throughout the present application to denote a surface of a material that is located between a topmost surface of the material and a bottommost surface of the material. The number of deep trenches may vary so long as at least one deep trench is formed. By way of one example, FIG. 2 illustrates the presence of two deep trenches 18.

The deep trench 18 can be formed utilizing a patterning process. In one example, the patterning process used to form the deep trench 18 may include photolithography and etching. The lithographic process includes forming a photoresist (not shown) atop a material or material stack to be patterned, i.e., the exemplary semiconductor structure shown in FIG. 1, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation). Typically, reactive ion etching is used in providing the deep trench 18.

The deep trench 18 may have a depth from 500 nm to 10 μm. Other depths for the deep trench 18 are possible depending on the thickness of the silicon device layer 16, the number of layers within the semiconductor material stack MS1 and the thickness of the base silicon substrate 10. The deep trench 18 that is formed has sidewall surfaces that are vertical relative to the exposed sub-surface 10A of the base silicon substrate 10.

Figure 3:
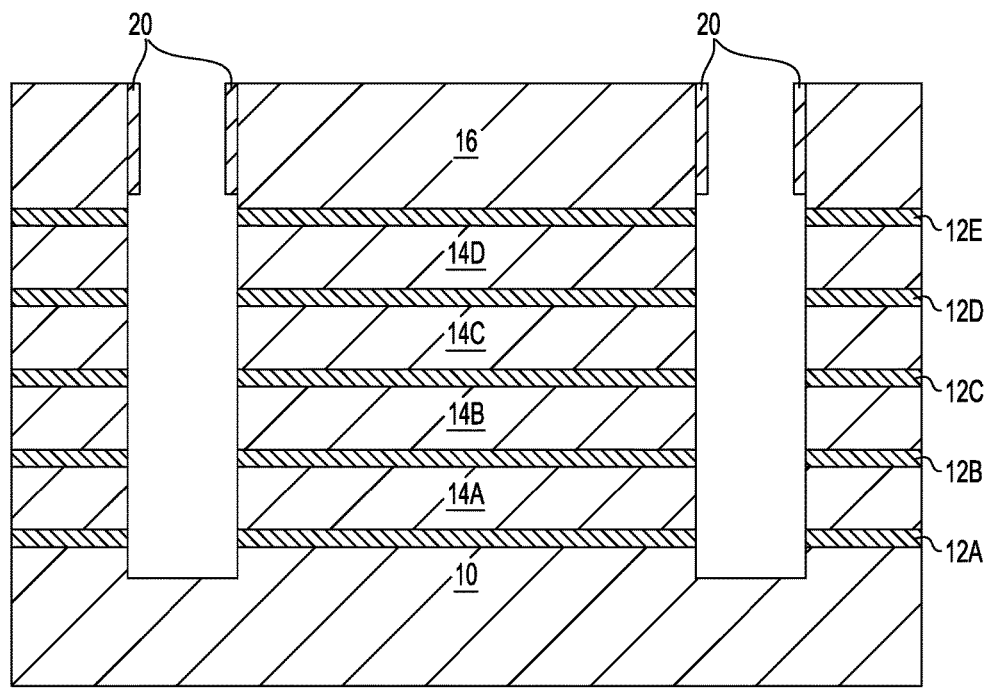
FIG. 3 is a cross sectional view of the exemplary semiconductor structure of FIG. 2 after forming a hanging spacer on physically exposed sidewall surfaces of the silicon device layer within the deep trench.

Referring now to FIG. 3, there is illustrated the exemplary semiconductor structure of FIG. 2 after forming a hanging spacer 20 on physically exposed sidewall surfaces of the silicon device layer 16 within the deep trench 18. Each hanging spacer 20 has a topmost surface that is coplanar with a topmost surface of the silicon device layer 16. In some embodiments and as shown in FIG. 3, each hanging spacer 20 covers at least a portion of one of the physically exposed sidewall surfaces of the silicon device layer 16. In such an embodiment, the bottommost surface of each hanging spacer 20 is located above a bottommost surface of the silicon device layer 16. In other embodiments (not shown), each hanging spacer 20 entirely covers one of the physically exposed sidewall surfaces of the silicon device layer 16. In such an embodiment, the bottommost surface of each hanging spacer 20 is coplanar with the bottommost surface of the silicon device layer 16.

Each hanging spacer 20 may be formed utilizing conventional techniques well known to those skilled in the art. In one example, each hanging spacer 20 is formed by first forming a sacrificial dielectric material (not shown) such as, for example, an oxide or nitride, partially within the deep trench 18. Next, a spacer dielectric material (not shown) is formed on all exposed surfaces of the exemplary semiconductor structure utilizing a deposition process such as, for example, chemical vapor deposition (CVD) or plasma enhanced chemical vapor deposition (PECVD) and thereafter an etch is employed to remove the spacer dielectric material from all horizontal surfaces of the exemplary semiconductor structure. The dielectric spacer material that remains after the etch provides the hanging spacer 20. After etching, the entirety of the sacrificial dielectric material is removed from the deep trench 18.

The spacer dielectric material that is used in providing the hanging spacer 20 is composed of a different dielectric material than the sacrificial dielectric material. For example, and when the sacrificial dielectric material is composed of an oxide, the spacer dielectric material is composed of a nitride such as, for example, silicon nitride or silicon oxynitride. In another example, and when the sacrificial dielectric material is composed of a nitride, the spacer dielectric material is composed of an oxide such as, for example; silicon dioxide.

Each hanging spacer 20 may have a width, as measured from one sidewall to an opposing sidewall, of from 1 nm to 20 nm. Other widths are possible and are not excluded from being used in the present application as the width of each hanging spacer 20 as long as the other widths do not entirely pinch off the opening of the deep trench 18.

Figure 4A:
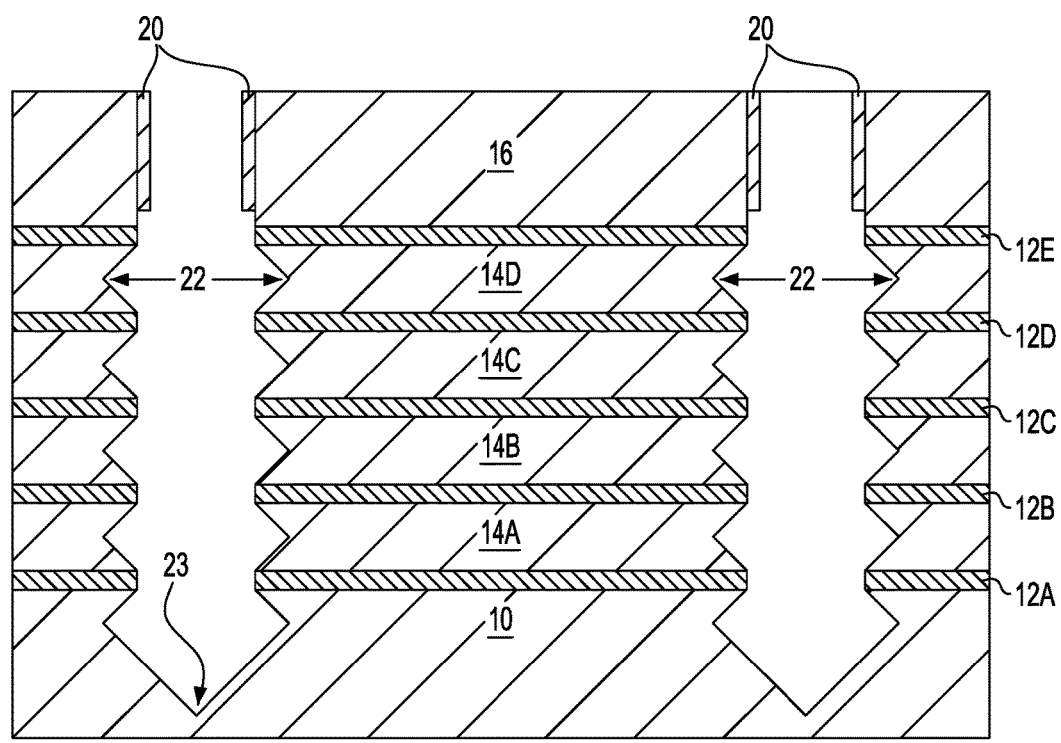
FIG. 4A is a cross sectional view of the exemplary semiconductor structure of FIG. 3 after performing a crystallographic etch in the deep trench that etches the layers of silicon selective to layers of boron doped silicon, wherein the etched silicon surfaces in the deep trench have a faceted sidewall surface.
Figure 4B:
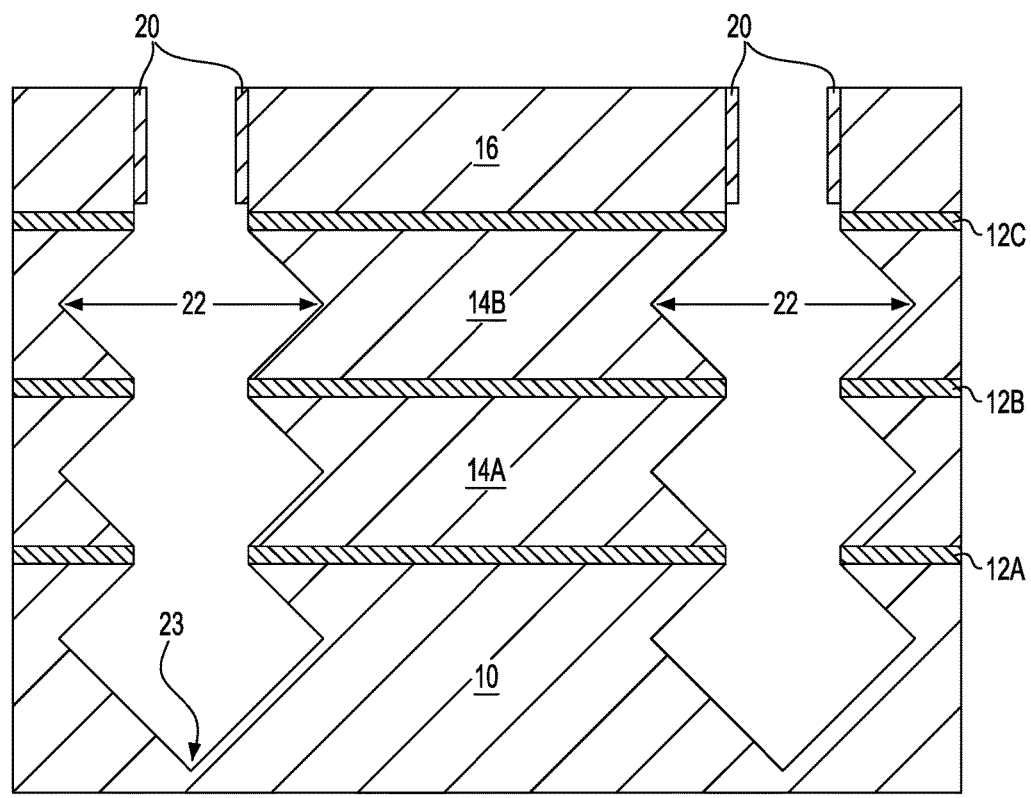
FIG. 4B is a cross sectional view of an exemplary semiconductor structure such as shown in FIG. 4A with less layers within the semiconductor material stack.

Referring now to FIG. 4A, there is illustrated the exemplary semiconductor structure of FIG. 3 after performing a crystallographic etch in the deep trench 18 that etches the layers of silicon selective to layers of boron doped silicon, wherein the etched silicon surfaces in the deep trench 18 have a faceted sidewall surface 22. FIG. 4B illustrates an exemplary semiconductor structure such as shown in FIG. 4A with less layers within the semiconductor material stack; this drawing was provided for clarity and will be used in the remaining drawings of the present application.

Prior to performing the etch, an etch mask (not shown) can be formed upon the topmost surface of the silicon device layer 16 and the etch mask can be removed after the etch utilizing techniques well known to those skilled in the art. The etch mask may be composed of a dielectric material or dielectric material stack and can be removed after performing the crystallographic etch.

The term "faceted sidewall surface" is used in the present application to a denote sidewall surface that is non-vertical relative to a horizontal plane. In one example, each faceted sidewall surface 22 may be a (111) bound silicon surface. In such an embodiment, sigma shaped regions can be formed between opposing faceted sidewall surfaces 22 within the deep trench 18. In the present application, the hanging spacer 20 serve as an etch mask during the crystallographic etch, and as such, the crystallographic etch does not etch the silicon device layer 16. The crystallographic etch does etch the various silicon layers (e.g., 14A, 14B, 14C, 14D) of the semiconductor material stack MS1, as well as the base silicon substrate 10. With respect to the base silicon substrate 10, the crystallographic etch also etches silicon beneath the sub-surface 10A and can provide a pointed bottommost surface 23. In one example, the crystallographic etch that can be employed in the present application may include a sigma etch that includes tetramethylammonium hydroxide (TMAH) as the wet etchant.

Figure 5:
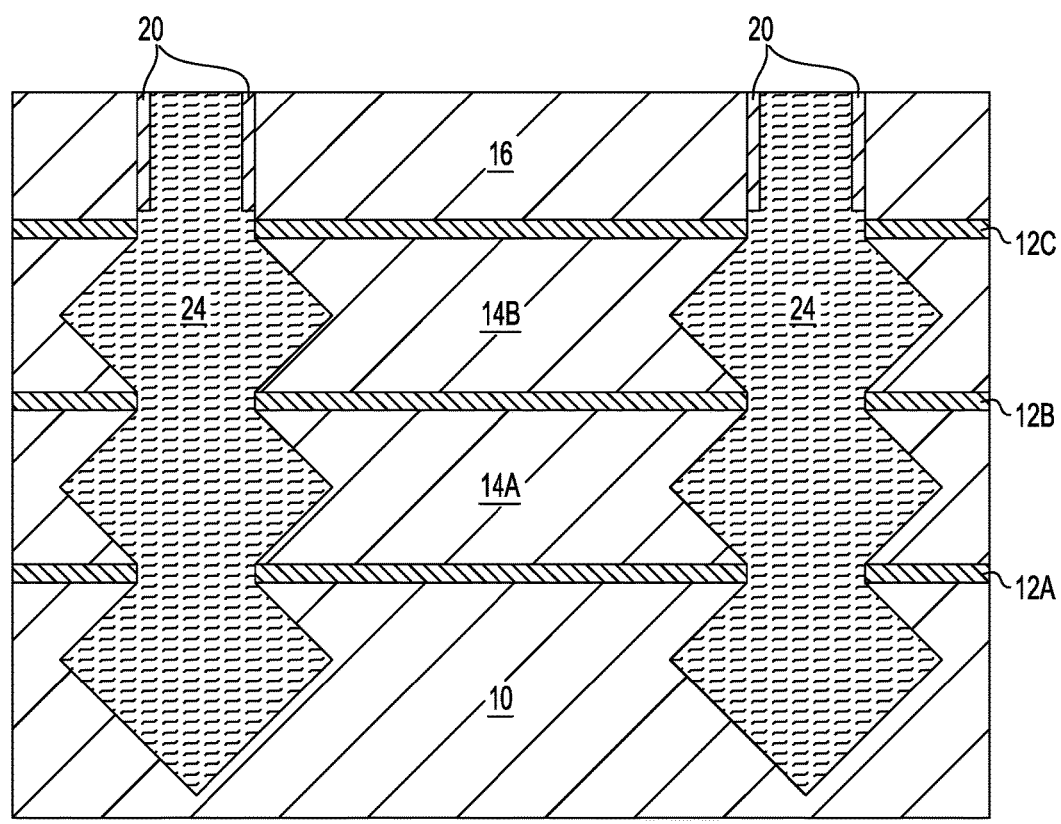
FIG. 5 is a cross sectional view of the exemplary semiconductor structure of FIG. 4B after filling the deep trench with an n-doped source material.

Referring now to FIG. 5, there is illustrated the exemplary semiconductor structure of FIG. 4B after filling the deep trench 18 with an n-doped source material 24. The term "n-doped" refers to an impurity that contributes free electrons to an intrinsic semiconductor material. In one example, the n-doped source material 24 is arsenic doped silicon glass (ASG). In another example, the n-doped source material 24 is phosphorus doped silicon glass (PSG).

The n-doped source material 24 can be formed utilizing a deposition process such as, for example, spin-on coating. In some embodiments, an etch back process or a planarization process such as, for example, chemical mechanical polishing, may follow the deposition of the n-doped source material 24.

As is shown, the n-doped source material 24 fills in the entirety of each deep trench 18 and contacts the etched sidewall surfaces of each of the silicon layers (e.g., 10, 14A, 14B) and the non-etched sidewall surfaces of each boron doped silicon layer (e.g., 12A, 1B, 12C). The n-doped source material 24 has a topmost surface that is coplanar with a topmost surface of each hanging spacer 20 as well as a topmost surface of the silicon device layer 16.

Figure 6:
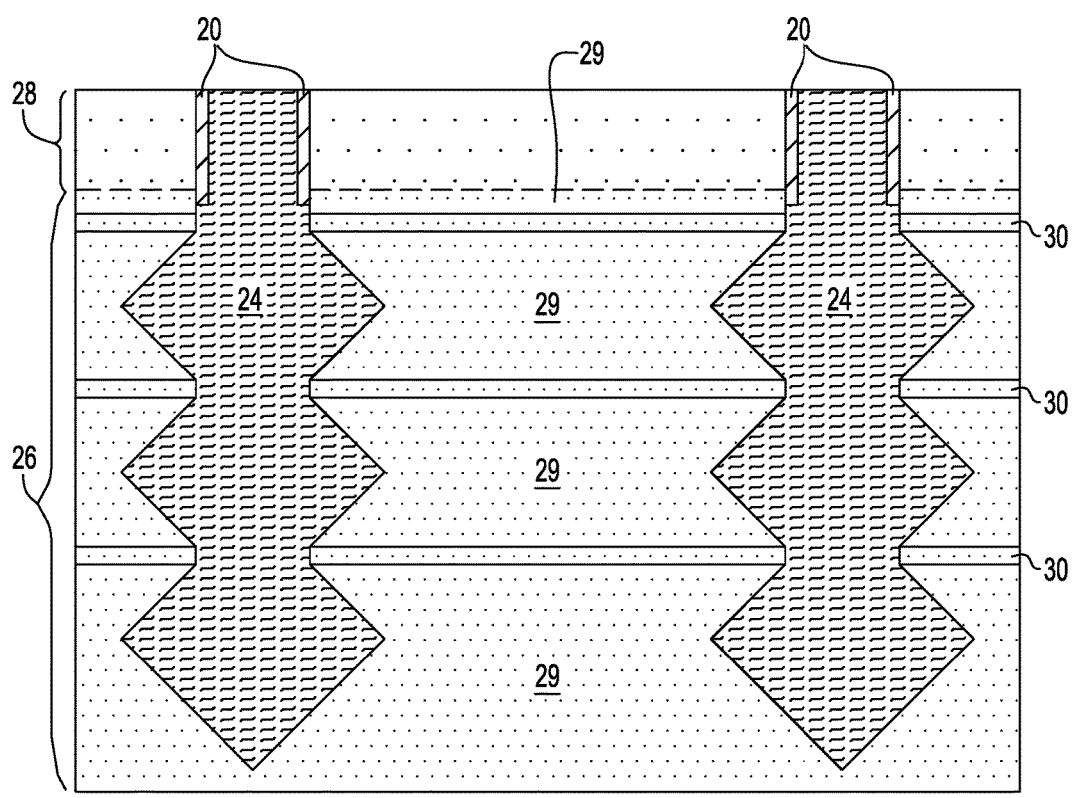
FIG. 6 is a cross sectional view of the exemplary semiconductor structure of FIG. 5 after performing an anneal to drive n-type dopant from the n-doped source material into the base silicon substrate, the semiconductor material stack, and the silicon device layer.

Referring now to FIG. 6, there is illustrated the exemplary semiconductor structure of FIG. 5 after performing an anneal. The anneal drives the n-type dopant from the n-doped source material 24 into the base silicon substrate 10, the semiconductor material stack MS1, and at least a lower portion of the silicon device layer 16. During this anneal, some boron can diffuse from the boron doped silicon layers (i.e., 12A, 12B, 12C) into the silicon layers (10, 14A, 14B and 16).

The anneal forms a bulk silicon substrate that contains a lower region 26 and an upper region 28. The upper region 28 is a silicon region that includes undoped silicon which is derived from an upper portion of the silicon device layer 16. The lower region 26 is composed of n-doped silicon. Within the lower region 26 of the bulk silicon substrate, there is alternating regions of n-doped silicon that have a first boron concentration (i.e., boron deficient regions), and regions of n-doped silicon that have a second boron concentration that is greater than the first boron concentration (i.e., boron rich regions). The n-doped silicon regions that are boron deficient are labeled as element 29 in FIG. 6, while the regions of n-doped silicon that contain the second boron concentration are labeled as element 30.

Each n-doped silicon regions that is boron deficient (i.e., region 29 in FIG. 6) has an n-type dopant concentration from 1E19 atoms/cm$^3$ to 5E20 atoms/cm$^3$ and a trace amount of boron (i.e., 1E16 atoms/cm$^3$ to 1E17 atoms/cm$^3$), especially near the former location of the boron doped silicon layers. Each n-doped silicon region that contains the second boron concentration (i.e., region 30 in FIG. 6) has an n-type dopant concentration from 1E19 atoms/cm$^3$ to 5E20 atoms/cm$^3$ and a boron dopant concentration of 1E17 atoms/cm$^3$ to 1E18 atoms/cm$^3$.

The anneal that can be performed in the present application may be performed at any temperature that is capable of causing diffusion of n-type dopant from the n-doped source material 24 into the precursor bulk semiconductor substrate (10, MS1, 16). In one embodiment, the anneal may be performed at a temperature from 900° C. to 1200° C. The anneal is typically performed in an inert ambient such as, for example, one of argon, neon or xenon, or a forming gas ambient. The anneal may be performed utilizing a furnace anneal, or a laser anneal and the duration of the anneal may vary depending on the type of anneal process that is performed.

Figure 7:
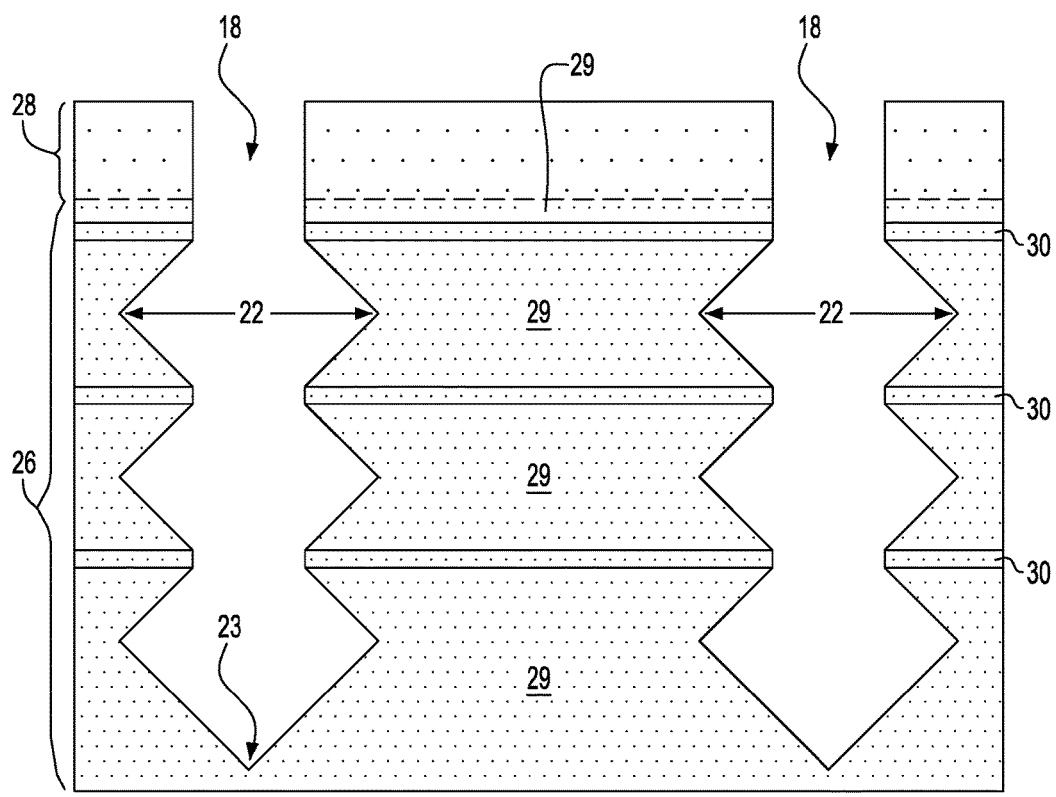
FIG. 7 is a cross sectional view of the exemplary semiconductor structure of FIG. 6 after removing the n-doped source material and each hanging spacer from the deep trench.

Referring now to FIG. 7, there is illustrated the exemplary semiconductor structure of FIG. 6 after removing the n-doped source material 24 and each hanging spacer 20 from the deep trench 18. The n-doped source material 24 and each hanging spacer 20 can be removed utilizing one or more material removal processes. In one example, the n-doped source material 24 may be removed utilizing a first etching process, and thereafter each hanging spacer 20 can be removed utilizing a second etching process that differs from the first etching process. The removal of the n-doped source material 24 and each hanging spacer 20 from the deep trench 18 exposes silicon surfaces within the deep trench 18 that is present in the bulk silicon substrate (26, 28, 29, 30).

Figure 8:
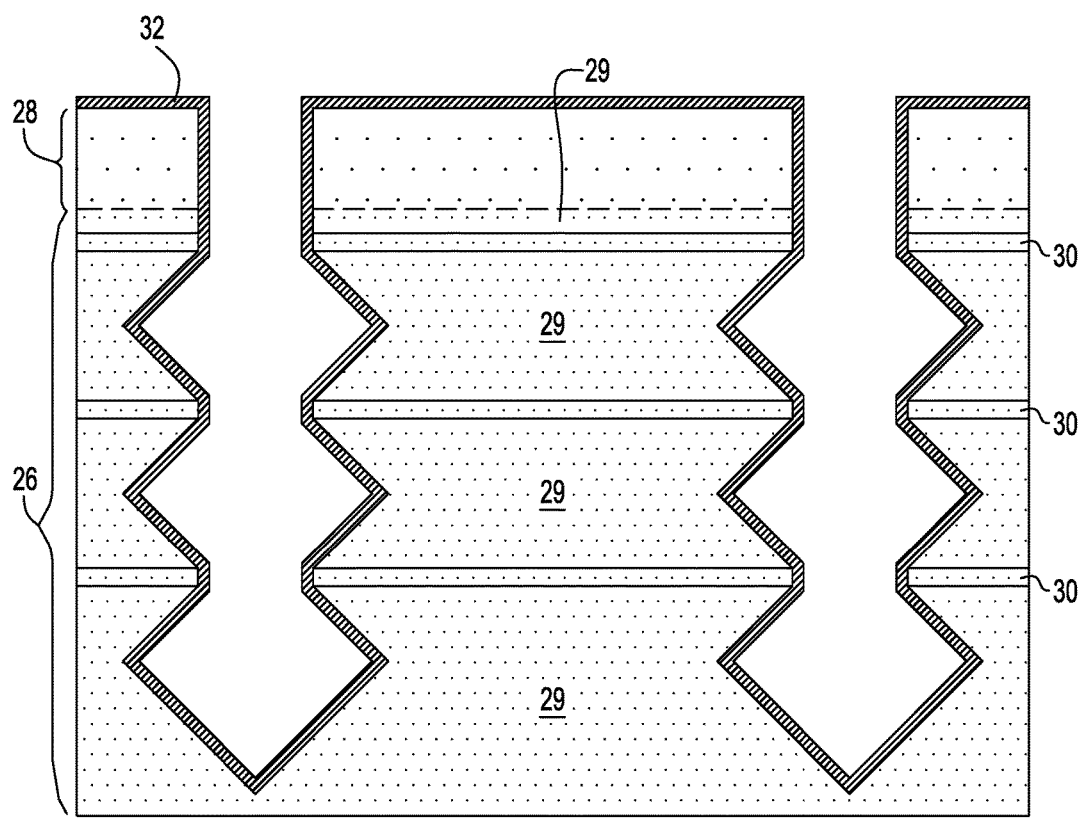
FIG. 8 is a cross sectional view of the exemplary semiconductor structure of FIG. 7 after forming a first conductive layer.

Referring now to FIG. 8, there is illustrated the exemplary semiconductor structure of FIG. 7 after forming a first conductive layer 32. The first conductive layer 32 is a continuous layer that is formed on the topmost surface of the bulk silicon substrate (26, 28, 29, 30) and along the exposed surfaces of the bulk silicon substrate (26, 28, 29, 30) exposed by the deep trench 18. The first conductive layer 32 will subsequently provide the bottom conductive electrode of a deep trench capacitor.

The first conductive layer 32 that is employed in the present application is composed of a metal-containing conductive material such as, for example, a conductive metal (such as, for example, tungsten), a conductive metal nitride (such as, for example, tungsten nitride, or titanium nitride) or a multilayered combination thereof. The first conductive layer 32 may be formed utilizing a conformal deposition process including, but not limited to, atomic layer deposition (ALD), chemical vapor deposition (CVD) or plasma enhanced chemical vapor deposition (PECVD). The first conductive layer 32 follows the contour of the deep trench 18 and does not entirely fill in the deep trench 18. In one embodiment, the first conductive layer 32 has a thickness from 2 nm to 10 nm.

Figure 9:
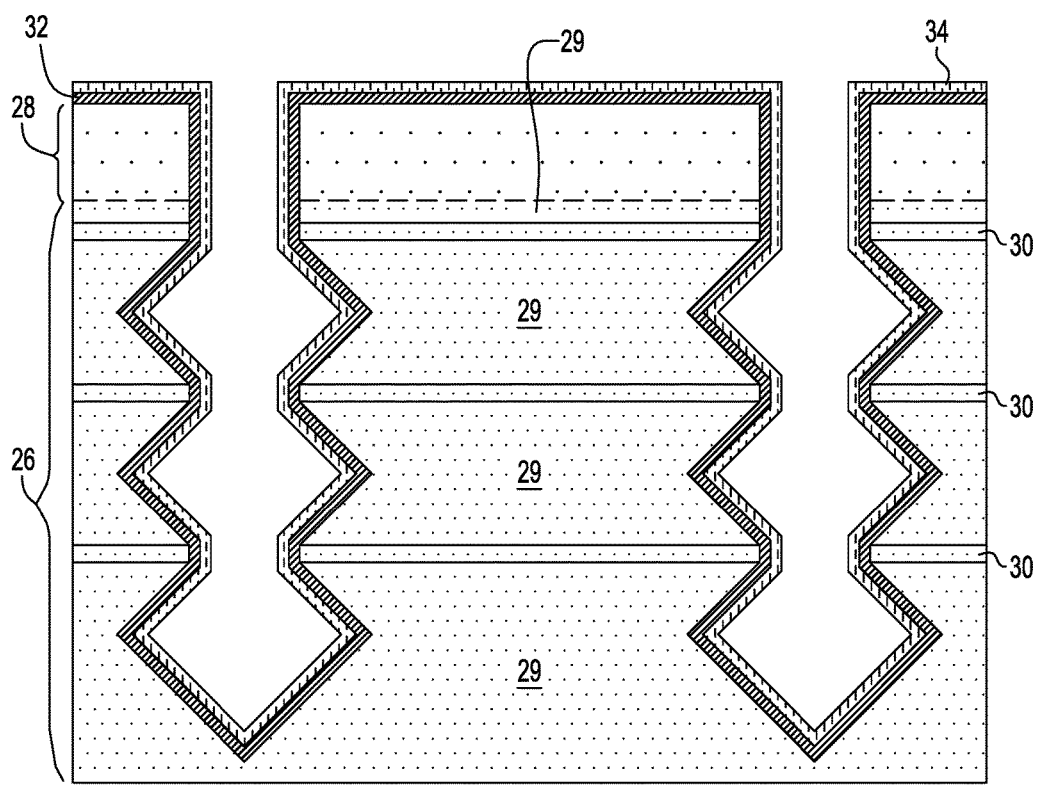
FIG. 9 is a cross sectional view of the exemplary semiconductor structure of FIG. 8 after forming a dielectric material layer.

Referring now to FIG. 9, there is illustrated the exemplary semiconductor structure of FIG. 8 after forming a dielectric material layer 34. The dielectric material layer 34 is continuous layer that is formed on the entirety of the first conductive layer 32. The dielectric material layer 34 will subsequently provide the node dielectric of the deep trench capacitor.

The dielectric material layer 34 may comprise any dielectric material appropriate for forming a trench capacitor, including but not limited to, silicon dioxide, silicon nitride, silicon oxynitride, a high-k material having a relative permittivity above about 8, or any combination of these dielectric materials. Examples of high-k materials include, but are not limited to, hafnium oxide, hafnium silicon oxide, hafnium silicon oxynitride, aluminum oxide, zirconium oxide, and any combination of these materials.

The dielectric material layer 34 may be formed by utilizing a deposition process such as, for example, atomic layer deposition (ALD), molecular layer deposition (MLD), chemical vapor deposition (CVD), or plasma enhanced chemical vapor deposition (PECVD. The dielectric material layer 34 follows the contour of the deep trench 18 and does not entirely fill in the deep trench 18. In one embodiment, the dielectric material layer 34 has a thickness from 1 nm to 5 nm.

Figure 10:
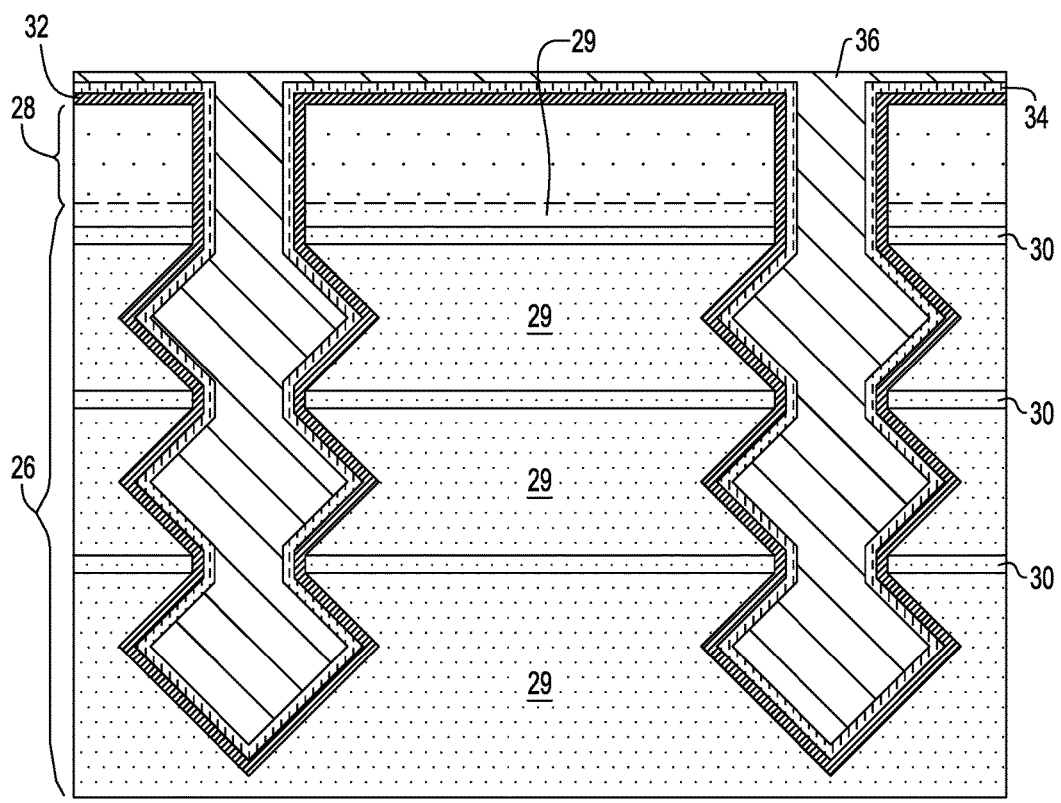
FIG. 10 is a cross sectional view of the exemplary semiconductor structure of FIG. 9 after forming a second conductive layer.

Referring now to FIG. 10, there is illustrated the exemplary semiconductor structure of FIG. 9 after forming a second conductive layer 36. The second conductive layer 36 is continuous layer that is formed on the entirety of the dielectric material 34 and entirely fills the remaining volume of the deep trench 18. The second conductive layer 36 will subsequently provide the top conductive electrode of the deep trench capacitor.

In one embodiment, the second conductive layer 36 that is employed in the present application is composed of a metal-containing conductive material such as, for example, a conductive metal (such as, for example, tungsten), a conductive metal nitride (such as, for example, tungsten nitride, or titanium nitride) or a multilayered combination thereof. In such an embodiment, the metal-containing conductive material that provides the second conductive layer 36 may, or may not, be the same as the metal-containing conductive material that provides the first conductive layer 32. In another embodiment, the second conductive layer 36 may be composed of a doped polycrystalline semiconductor material such as, for example, arsenic doped polysilicon.

The second conductive layer 36 may be formed utilizing a conformal deposition process including, but not limited to, atomic layer deposition (ALD), chemical vapor deposition (CVD) or plasma enhanced chemical vapor deposition (PECVD). The second conductive layer 36 may include an overburden upper portion that is formed outside the deep trench 18.

Figure 11:
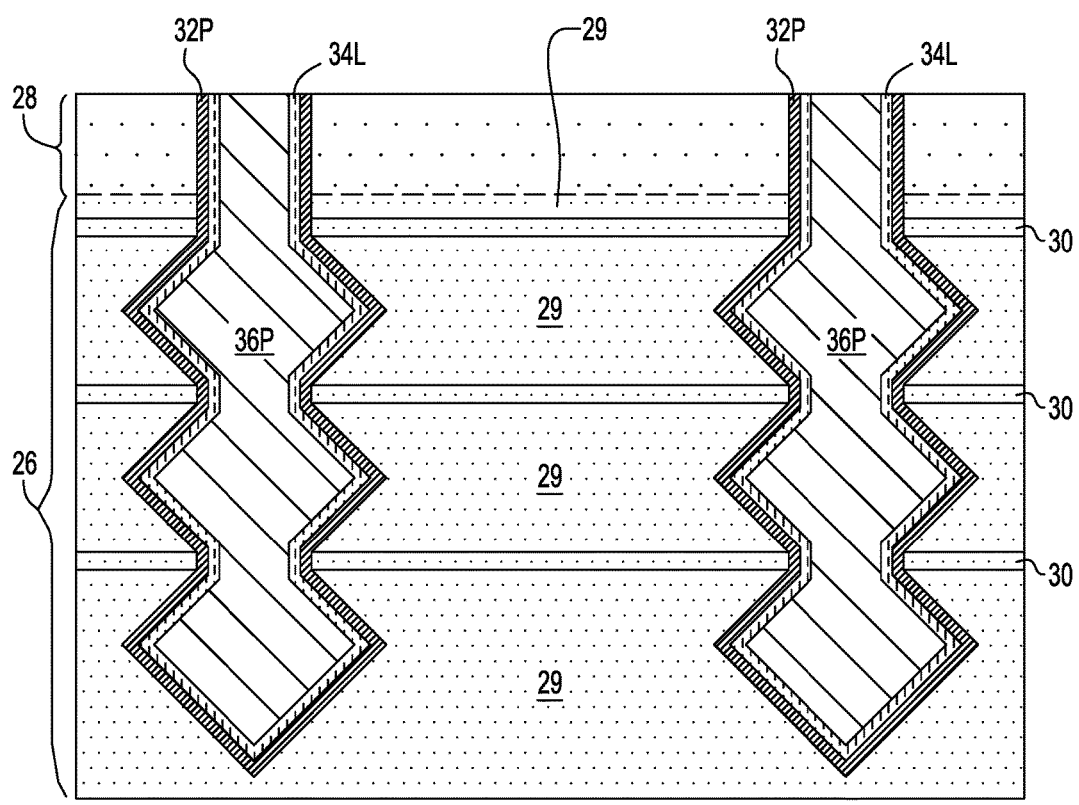
FIG. 11 is a cross sectional view of the exemplary semiconductor structure of FIG. 10 after removing portions of the first conductive layer, the dielectric material layer and the second conductive layer that are present outside the deep trench, while maintaining portions of the first conductive layer, the dielectric material layer and the second conductive layer that are present inside the deep trench.

Referring now to FIG. 11, there is illustrated the exemplary semiconductor structure of FIG. 10 after removing portions of the first conductive layer 32, the dielectric material layer 34 and the second conductive layer 36 that are present outside the deep trench 18, while maintaining portions of the first conductive layer 32, the dielectric material layer 34 and the second conductive layer 36 that are present inside the deep trench 18. The remaining first conductive layer 32 within the deep trench 18 may be referred to herein as a bottom electrode plate 32P, the remaining dielectric material layer 34 within the deep trench may be referred to as a node dielectric 34L, and the remaining second conductive layer 36 in the deep trench may be referred to herein as a top conductive plate 36P. Collectively, the bottom electrode plate 32P, the node dielectric 34L, and the top electrode plate 36P constitute the deep trench capacitor of the present application.

The removal of portions of the first conductive layer 32, the dielectric material layer 34 and the second conductive layer 36 that are present outside the deep trench 18 may be performed utilizing one or more material removal processes. In one embodiment, the one or more material removal processes include a planarization process such as, chemical mechanical polishing and/or grinding.

At this point of the present application, the bottom electrode plate 32P, the node dielectric 34L, and the top electrode plate 36P have topmost surfaces that are coplanar with each other as well as being coplanar with a topmost surface of the upper portion 28 of the bulk silicon substrate.

Semiconductor devices including, for example, transistors may now be formed upon, and within the upper portion 28 of the bulk silicon substrate utilizing conventional techniques well known in the art.

Figure 12:
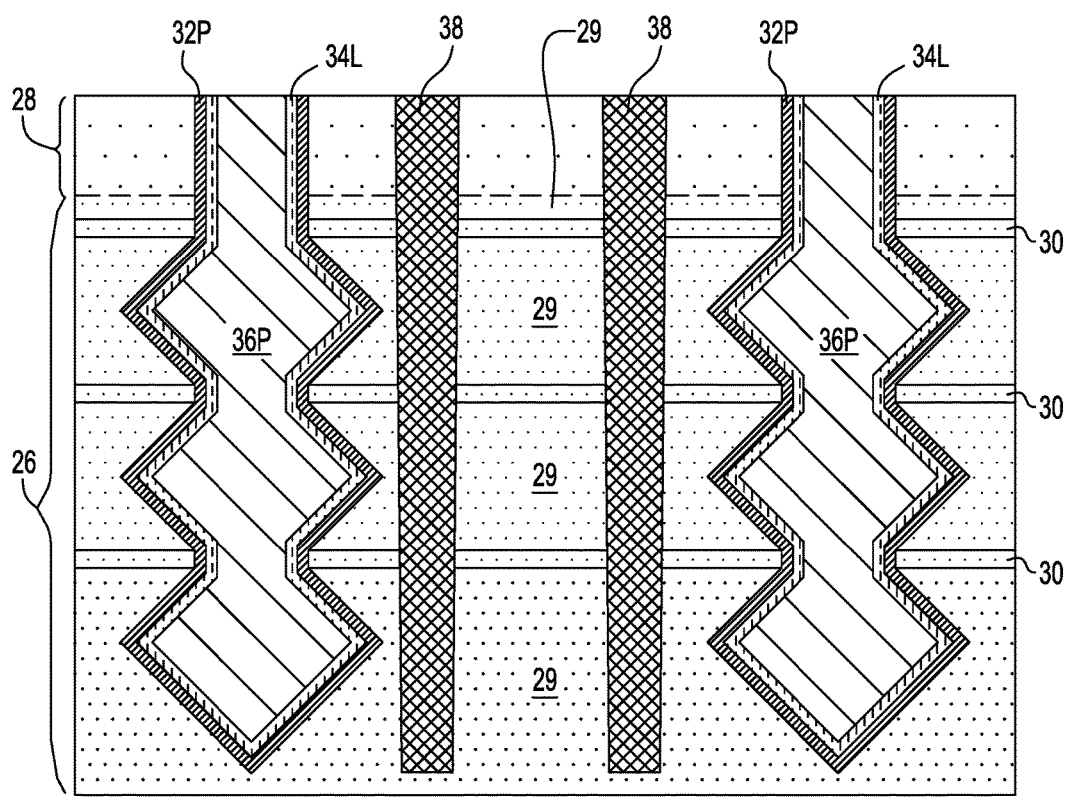
FIG. 12 is a cross sectional view of the exemplary semiconductor structure of FIG. 11 after forming at least one deep trench contact.

Referring now to FIG. 12, there is illustrated the exemplary semiconductor structure of FIG. 11 after forming a deep trench contact 38. A single deep trench contact is formed for each deep trench capacitor that is formed. Each deep trench contact 38 extends from the topmost surface of the upper portion 28 of the bulk silicon substrate and into a bottommost n-doped silicon region that is boron deficient and that is present in the lower region 26 of the bulk silicon substrate.

Each deep trench contact 38 may include a contact metal or metal alloy such as, for example, copper, aluminum, cobalt, or a copper-aluminum alloy. Each deep trench contact 38 may be formed by first providing a deep contact trench (not shown) into the bulk silicon substrate (26, 28, 29, 30), and then filling the deep contact trench with a contact metal or metal alloy. The filling of the deep contact trench may include a deposition process and a planarization process may follow the deep contact trench fill.

Each deep trench contact 38 has a topmost surface that is coplanar with the topmost surface of each element of the deep trench capacitor (32P, 34L, 36P) as well as the topmost surface of the upper region 28 of the bulk silicon substrate.

FIGS. 11 and 12 illustrate a semiconductor structure in accordance with an embodiment of the present application. In the illustrated embodiment, the semiconductor structure includes a deep trench capacitor (32P, 34L, 36P) present in a deep trench 18 having faceted sidewall surfaces 22 that is located in a bulk silicon substrate (26, 28, 29, 30), wherein the bulk silicon substrate includes an upper region 28 of undoped silicon and a lower region 26 of n-doped silicon, wherein the lower region 28 comprises alternating regions of n-doped silicon that have the first boron concentration (i.e., boron deficient regions 29), and regions of n-doped silicon that have the second boron concentration (i.e., boron rich regions 30).

Figure 13:
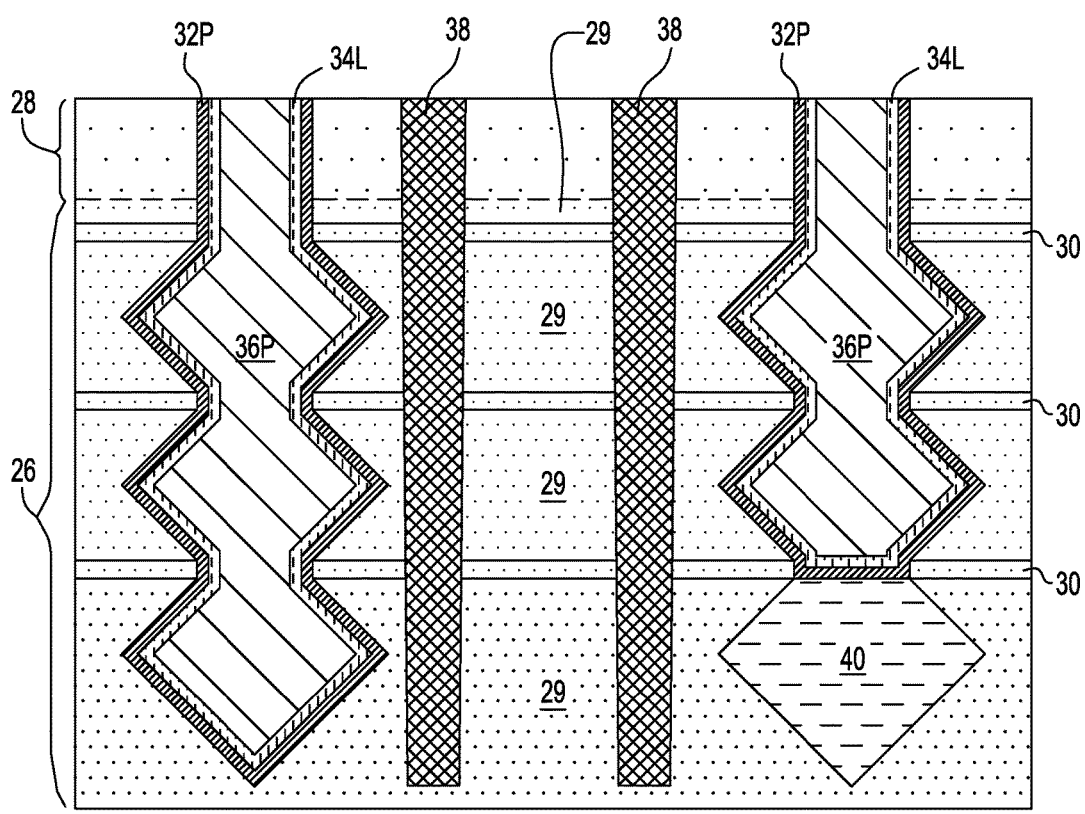
FIG. 13 is a cross sectional view illustrating another exemplary semiconductor structure in accordance with the present application.

Referring now to FIG. 13, there is illustrated another exemplary semiconductor structure of the present application. The exemplary semiconductor structure of FIG. 13 is similar to the one shown in FIG. 12 except that a flowable dielectric material 40 such as, a flowable oxide, is formed within a lower portion of one of the deep trenches 18. As is shown, the flowable dielectric material 40 is located in a lower portion of one of the deep trenches 18 and is located entirely beneath one of the deep trench capacitors (32P, 34L, 36P). The flowable dielectric material 40 may be formed into any number of regions within the deep trench 18 prior to forming the deep trench capacitor (32P, 34L, 36P). This allows for tailoring the capacitance value of any given deep trench capacitor (32P, 34L, 36P). In the illustrated example, the deep trench capacitor (32P, 34L, 36P) on the far left hand side of the drawing has a different capacitance than the deep trench capacitor (32P, 34L, 36P) on the far right hand side of the drawing.

In FIG. 13, a semiconductor structure is provided that includes a first deep trench capacitor (32P, 34L, 36P on the far left hand side) present in a first deep trench 18 having faceted sidewall surfaces 22 that is located in a bulk silicon substrate (26, 28, 29, 30), wherein the bulk silicon substrate includes an upper region 28 of undoped silicon and a lower region 26 of n-doped silicon, wherein the lower region 26 comprises alternating regions of n-doped silicon that have the first boron concentration (i.e., boron deficient regions 29), and regions of n-doped silicon that have the second boron concentration (i.e., boron rich regions 30). A second deep trench capacitor (32P, 34L, 36P on the far right hand side) is present in a second deep trench 18 having faceted sidewall surfaces 22 that is located in the bulk silicon substrate (26, 28, 29, 30), wherein a flowable dielectric material 40 is located in a lower portion of the second deep trench 18 and located entirely beneath the second deep trench capacitor (32P, 34L, 36P on the far right hand side).

Tailoring of the capacitance of each deep trench capacitor (32P, 34L, 36P) can be provided by the shape of the deep trench 18 that is formed after performing the crystallographic etch, and/or by forming a flowable dielectric material 40 within some portions of the deep trench 18 after performing the crystallographic etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a deep trench capacitor present in a deep trench having faceted sidewall surfaces that is located in a bulk silicon substrate, wherein the bulk silicon substrate includes an upper region of undoped silicon and a lower region of n-doped silicon, wherein the lower region comprises alternating regions of n-doped silicon that have a first boron concentration, and regions of n-doped silicon that have a second boron concentration which is greater than the first boron concentration.

2. The semiconductor structure of claim 1, further comprising a flowable dielectric material located in a lower portion of the deep trench and located entirely beneath the deep trench capacitor.

3. The semiconductor structure of claim 1, wherein an area in the deep trench that is located between opposing faceted sidewall surfaces has a sigma shape.

4. The semiconductor structure of claim 3, wherein the faceted sidewall surfaces are (111) bound silicon surfaces.

5. The semiconductor structure of claim 1, wherein the lower region of n-doped silicon comprises arsenic or phosphorus as the n-type dopant.

6. The semiconductor structure of claim 1, wherein the second boron concentration is from 1E17 atoms/cm$^3$ to 1E18 atoms/cm$^3$.

7. The semiconductor structure of claim 1, wherein the deep trench capacitor comprises a bottom electrode plate, a node dielectric, and a top electrode plate, wherein each of the bottom electrode plate, the node dielectric, and the top electrode plate has a topmost surface that is coplanar with each other as well as being coplanar with a topmost surface of the upper portion of the bulk silicon substrate.

8. The semiconductor structure of claim 7, wherein the deep trench capacitor extends into a bottommost region of n-doped silicon that has the first boron concentration.

9. The semiconductor structure of claim 1, further comprising a deep trench contact, wherein the deep trench contact extends into the bottommost region of n-doped silicon that has the first boron concentration.

10. A semiconductor structure comprising:
a first deep trench capacitor present in a first deep trench having faceted sidewall surfaces that is located in a bulk silicon substrate, wherein the bulk silicon substrate includes an upper region of undoped silicon and a lower region of n-doped silicon, wherein the lower region comprises alternating regions of n-doped silicon that have a first boron concentration, and regions of n-doped silicon that have a second boron concentration which is greater than the first boron concentration; and
a second deep trench capacitor present in a second deep trench having faceted sidewall surfaces that is located in the bulk silicon substrate, wherein a flowable dielectric material is located in a lower portion of the second deep trench and located entirely beneath the second deep trench capacitor.

* * * * *